(12) United States Patent
Lim et al.

(10) Patent No.: US 8,039,344 B2
(45) Date of Patent: Oct. 18, 2011

(54) METHODS OF FORMING A CAPACITOR STRUCTURE AND METHODS OF MANUFACTURING A SEMICONDUCTOR DEVICE USING THE SAME

(75) Inventors: Han-Jin Lim, Seoul (KR); Jae-Hong Seo, Yongin-si (KR); Seok-Woo Nam, Seongnam-si (KR); Bong-Hyun Kim, Incheon (KR); Taek-Soo Jeon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/954,050

(22) Filed: Nov. 24, 2010

(65) Prior Publication Data
US 2011/0124176 A1  May 26, 2011

(30) Foreign Application Priority Data
Nov. 26, 2009 (KR) .................. 10-2009-0115037

(51) Int. Cl.
*H01L 21/02* (2006.01)
(52) U.S. Cl. .. 438/255; 438/398; 257/309; 257/E21.013

(58) Field of Classification Search .......... 438/253–256, 438/396–399; 257/306–309, E21.013, E27.016
See application file for complete search history.

(56) References Cited

U.S. PATENT DOCUMENTS

| | | | | |
|---|---|---|---|---|
| 5,760,434 A | * | 6/1998 | Zahurak et al. | 257/309 |
| 6,222,722 B1 | * | 4/2001 | Fukuzumi et al. | 361/305 |
| 2005/0153518 A1 | * | 7/2005 | You et al. | 438/397 |

FOREIGN PATENT DOCUMENTS

| KR | 1020040077041 A | 9/2004 |
|---|---|---|
| KR | 1020060011559 A | 2/2006 |

* cited by examiner

*Primary Examiner* — Matthew Smith
*Assistant Examiner* — Daniel Shook
(74) *Attorney, Agent, or Firm* — Myers Bigel Sibley & Sajovec, P.A.

(57) ABSTRACT

In a method of forming a capacitor, a seed stopper and a sacrificial layer is formed on an insulating interlayer having a plug therethrough. An opening is formed through the sacrificial layer and the seed stopper to expose the plug. A seed is formed on an innerwall of the opening. A lower electrode is formed covering the seed on the innerwall of the opening. The sacrificial layer and the seed are removed. A dielectric layer and an upper electrode are sequentially formed on the lower electrode.

15 Claims, 14 Drawing Sheets

METHODS OF FORMING A CAPACITOR STRUCTURE AND METHODS OF MANUFACTURING A SEMICONDUCTOR DEVICE USING THE SAME

CLAIM OF PRIORITY

This application claims priority under 35 USC §119 to Korean Patent Application No. 2009-0115037, filed on Nov. 26, 2009 in the Korean Intellectual Property Office (KIPO), the contents of which are herein incorporated by reference in their entirety.

BACKGROUND

1. Field

Example embodiments relate to a capacitor structure, a semiconductor device including the same, a method of forming a capacitor, and a method of manufacturing a semiconductor device using the same.

2. Description of the Related Art

As semiconductor devices have been highly integrated, an area of a lower electrode of a capacitor may not be easily increased in order to obtain a high capacitance of the capacitor. The area may be increased using a hemi-spherical grain (HSG) as a seed for forming the lower electrode. However, a plug contacting the lower electrode may be partially removed during a process for removing the seed. Accordingly, the lower electrode may have a bad contact with the plug.

SUMMARY

Example embodiments provide a method of forming a capacitor structure having a good contact with a plug.

Example embodiments provide a method of manufacturing a semiconductor device using the method of forming the capacitor structure.

Example embodiments provide a capacitor structure having a good contact with a plug.

Example embodiments provide a semiconductor device including the capacitor structure.

According to example embodiments, there is provided a method of forming a capacitor structure. A seed stopper and a sacrificial layer may be formed on an insulating interlayer having a plug therethrough. An opening may be formed through the sacrificial layer and the seed stopper to expose the plug. A seed may be formed on an inner wall of the opening. A lower electrode covering the seed may be formed on the inner wall of the opening The sacrificial layer and the seed may be removed. A dielectric layer and an upper electrode may be formed sequentially on the lower electrode.

In example embodiments, the seed may not be formed on the seed stopper.

In example embodiments, a first etch stop layer may be formed on the plug and the insulating interlayer prior to forming the seed stopper and the sacrificial layer on the insulating interlayer.

In example embodiments, the sacrificial layer may be formed using propylene oxide (PDX), phenyltriethoxysilane (PTEOS), boro-phosphoro silicate glass (BPSG), or phosphor silicate glass (PSG), and the first etch stop layer may be formed using silicon nitride.

In example embodiments, a second etch stop layer may be formed on the seed stopper.

In example embodiments, the lower electrode may sufficiently fill a remaining portion of the opening.

In example embodiments, the seed stopper may be formed using silicon oxide, aluminum oxide or tantalum oxide.

In example embodiments, the seed may be formed by a low pressure chemical vapor deposition (LPCVD) process or a rapid thermal chemical vapor deposition (RTCVD) process.

In example embodiments, the seed may be formed using silicon source gas or using silicon source gas and germanium source gas.

In example embodiments, the sacrificial layer may be removed using limulus amoebocyte lysate (LAL) solution and the seed may be removed using standard cleaning 1 (SC1) solution.

In example embodiments, the lower electrode may be formed using copper (Cu), aluminum (Al), tungsten (Tu), rubidium (Rb), iridium (Ir), titanium nitride (TiNx), tantalum nitride ($TaN_x$) or tungsten nitride ($WN_x$).

In example embodiments, the plug may include polysilicon or a metal.

In example embodiments, the seed may include a hemi-spherical grain (HSG).

According to example embodiments, there is provided a method of manufacturing a semiconductor device. A transistor including a gate structure and an impurity region may be formed on a substrate. An insulating interlayer having a plug therein and covering the transistor may be formed on the substrate. The plug may be electrically connected to the impurity region. A seed stopper and a sacrificial layer may be formed on the insulating interlayer. An opening may be formed through the sacrificial layer and the seed stopper to expose the plug. A seed may be formed on an inner wall of the opening. A lower electrode covering the seed may be formed on the inner wall of the opening. The sacrificial layer and the seed may be removed. A dielectric layer and an upper electrode may be formed sequentially on the lower electrode.

According to example embodiments, there is provided a capacitor structure. The capacitor structure may include a lower electrode on a plug through an insulating interlayer, a seed stopper on the insulating interlayer, a dielectric layer on the lower electrode and an upper electrode on the dielectric layer. The lower electrode may include a sidewall having a concave hemi-spherical shape and the seed stopper may contact a portion of a sidewall of the lower electrode having no hemi-spherical concave shape.

In example embodiments, a first etch stop layer may be formed between the insulating interlayer and the seed stopper, and a second etch stop layer may be formed on the seed stopper.

In example embodiments, a seed may be formed between the plug and the lower electrode.

In example embodiments, the seed stopper may include silicon oxide, aluminum oxide or tantalum oxide.

According to example embodiments, there is provided a semiconductor device. The semiconductor device may include a transistor including a gate structure and an impurity region, a plug electrically connected to the impurity region through an insulating interlayer covering the transistor, a lower electrode on the plug,
  a seed stopper on the insulating interlayer, a dielectric layer on the lower electrode and an upper electrode on the dielectric layer. The lower electrode may include a sidewall having a concave hemi-spherical shape and the seed stopper may contact a portion of a sidewall of the lower electrode having no hemi-spherical concave shape;

BRIEF DESCRIPTION OF THE DRAWINGS

Example embodiments will be more clearly understood from the following detailed description taken in conjunction with the accompanying drawings, in which.

DETAILED DESCRIPTION OF THE EMBODIMENTS

Figure 1:
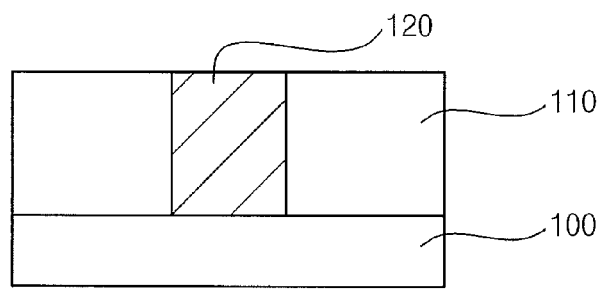
FIGS. 1 to 8 are cross-sectional views illustrating a method of forming a capacitor according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 8 are cross-sectional views illustrating a method of forming a capacitor structure according to example embodiments.

Referring to FIG. 1, an insulating interlayer 110 may be formed on a substrate 100.

The substrate 100 may include a semiconductor substrate such as a silicon (Si) substrate, a germanium (Ge) substrate, a silicon-on-insulator (SOI) substrate, a germanium-on-insulator (GOI), etc. The substrate may be doped with n-type or p-type impurities.

The insulating interlayer 110 may be formed using a silicon oxide. For example, the insulating interlayer 110 may be formed using boro-phosphoro silicate glass (BPSG), undoped silicate glass (USG), silicon on glass (SOG), etc. The insulating interlayer 110 may be formed by a deposition process such as a chemical vapor deposition (CVD) process, a physical vapor deposition (PVD) process, etc.

A plug 120 may be formed through the insulating interlayer 110. Particularly, a hole (not shown) may be formed through the insulation interlayer 110 to expose a top surface of the substrate 100, and a conductive layer may be formed on the top surface of the substrate 100 and the insulating interlayer 110 to fill the hole. The conductive layer may be formed by a deposition process such as a CVD process, a PVD process, an atomic layer deposition (ALD) process, etc., using doped polysilicon, a metal, etc. An upper portion of the conductive layer may be removed until the insulation interlayer 110 may be exposed by a chemical mechanical polishing (CMP) process and/or an etch-back process to form the plug 120 filling the hole.

Figure 2:
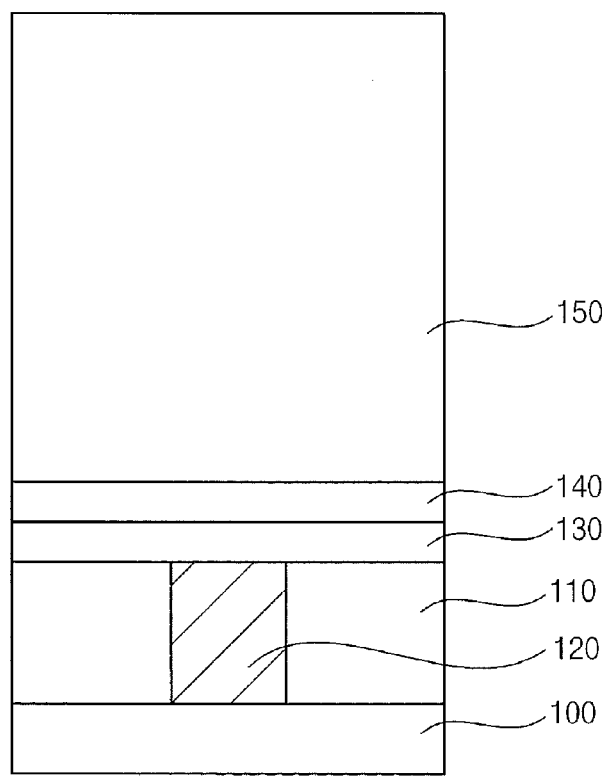

Referring to FIG. 2, an etch stop layer 130, a seed stopper 140, and a sacrificial layer 150 may be formed sequentially on the insulating interlayer 110 and the plug 120.

The etch stop layer 130 may be formed by a deposition process such as a CVD process, a PVD process, an ALD process, etc., using silicon nitride. The etch stop layer 130 may serve as an etching endpoint in an etching process for forming an opening 155 (see FIG. 3). Alternatively, the etch stop layer 130 may not be formed.

The seed stopper 140 may reduce or prevent the formation of a seed in a process for forming the seed. The seed stopper 140 may be formed using a thermal oxide such as silicon oxide, aluminum oxide, tantalum oxide, etc. The seed stopper 140 may be formed by a deposition process such as a CVD process, a PVD process, an ALD process, etc.

The sacrificial layer 150 may be formed by a deposition process such as a CVD process, a PVD process, an ALD process, etc., using an oxide such as propylene oxide (PDX), phenyltriethoxysilane (PTEOS), boro-phosphoro silicate glass (BPSG), phosphor silicate glass (PSG), etc.

Figure 3:
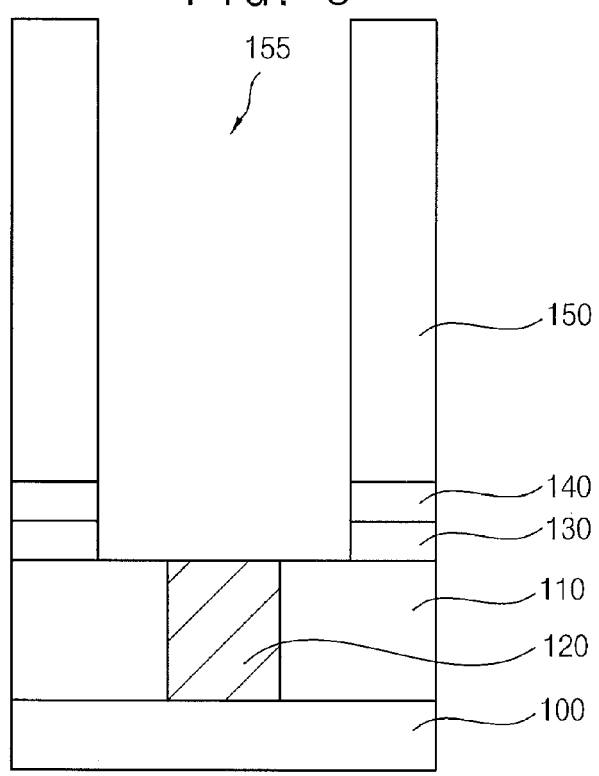

Referring to FIG. 3, the sacrificial layer 150, the seed stopper 140 and the etch stop layer 130 may be partially removed to form the opening 155 exposing the plug 120.

Particularly, the sacrificial layer 150 and the seed stopper 140 may be removed until the etch stop layer 130 may be exposed by a first dry etching process using a first etching gas. The exposed etch stop layer 130 may be removed by a second dry etching process using a second etching gas to expose the plug 120. In an example embodiment, the first etching gas may include hydrogen fluoride (HF) and the second etching gas may include monofluoromethane ($CH_3F$), trifluoromethane ($CHF_3$), tetrafluoromethane ($CF_4$), hexafluoroethane ($C_2F_6$), nitrogen trifluorude ($NF_3$), etc. When the etch stop layer 130 is not formed, the opening 155 may be formed only by the first dry etching process using the first etching gas. In an example embodiment, the sacrificial layer 150 and the seed stopper 140 may be etched using different etching gases, respectively.

Figure 4:
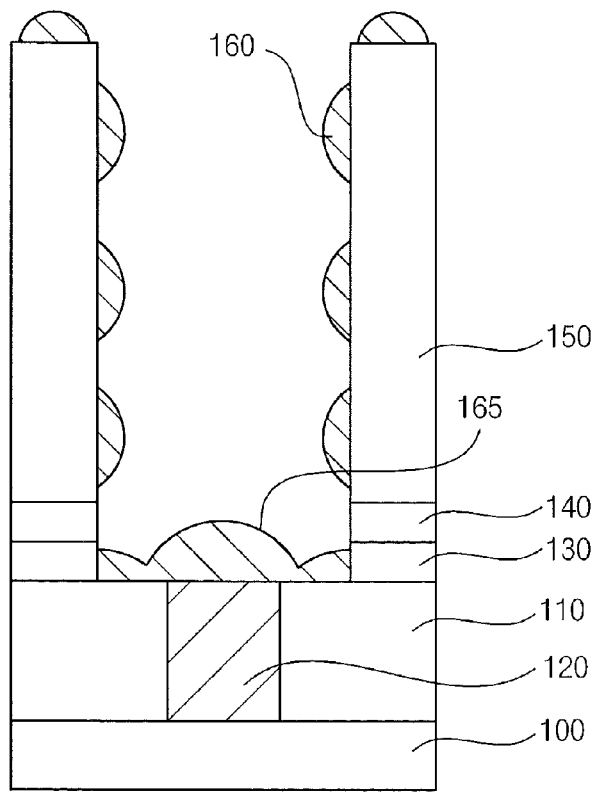

Referring to FIG. 4, seeds 160 and 165 may be formed on an inner wall of the opening 155.

Particularly, the seeds 160 and 165 may be formed by a deposition process such as a low pressure chemical vapor deposition (LPCVD) process, a rapid thermal chemical vapor deposition (RTCVD) process, etc. In an example embodiment, the seeds 160 and 165 may be formed using a silicon source gas including silane or silicon tetrachloride ($SiCl_4$). In some example embodiments, the seeds 160 and 165 may be formed using a germanium source gas including germane ($GeH_4$) or germanium tetrachloride ($GeCl_4$) together with the silicon source gas. Additionally, the seeds 160 and 165 may be doped with impurities using an impurity source gas. Particularly, the seeds 160 and 165 may be formed using an impurity source gas including diborane ($B_2H_6$) or phosphine ($PH_3$) together with the silicon source gas and/or the germanium source gas, or the seeds 160 and 165 may be formed first using the silicon source gas and/or the germanium source gas, and may be doped with impurities using the impurity source gas afterwards.

The seeds 160 and 165 may be divided into a first seed 160 and a second seed 165 according to positions thereof. That is, the first seed 160 may be formed on a sidewall of the opening 155, and the second seed 165 may be formed on a bottom of the opening 155.

Specifically, the first seed 160 may be formed on a sidewall of the sacrificial layer 150 including BPSQ etc., and may not be formed on a sidewall of the seed stopper 140 including the thermal oxide, because an initial time for deposition of the seeds 160 and 165 may differ according to a material of an underlayer. When seeds are formed on a thermal oxide layer, the initial time for deposition thereof may be longer than that when the seeds are formed on a BPSG layer. Thus, a process for forming the seeds 160 and 165 may be performed during a time shorter than the initial time for depositing the seeds 160 and 165 on the seed stopper 140, so that the first seed 160 may be formed only on the sidewall of the sacrificial layer 150.

The second seed 165 may be formed on the plug 120 and a portion of the second seed 165 may make contact with a sidewall of the etch stop layer 130. The plug 120 may include e.g., polysilicon, and the etch stop layer 130 may include silicon nitride. An initial time for depositing the second seed 165 on the plug 120 and the etch stop layer 130 may be relatively short, and thus the second seed 165 may be formed thereon.

Figure 5:
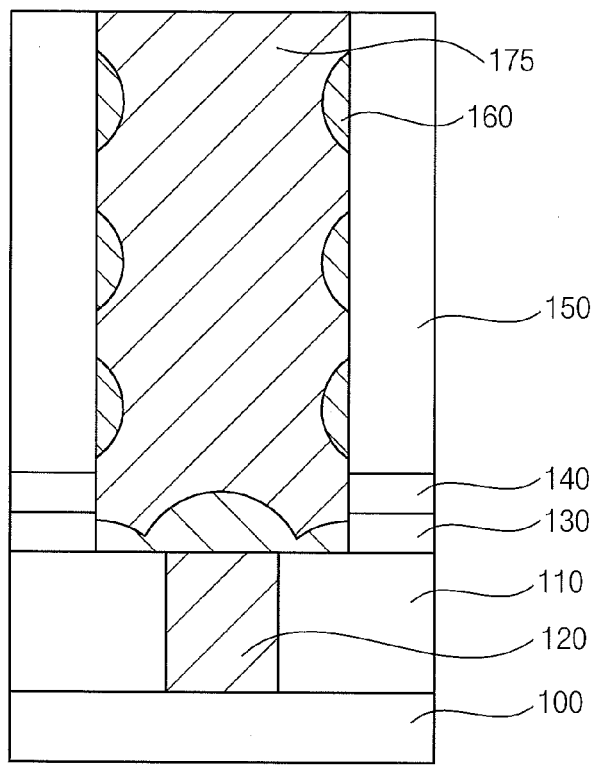

In example embodiments, the seeds 160 and 165 may be hemi-spherical grains (HSG), and thus may increase a surface area of a lower electrode 175 (see FIG. 5).

Referring to FIG. 5, the lower electrode 175 covering the seeds 160 and 165 may be foamed to fill a remaining portion of the opening 155.

Particularly, a lower electrode layer may be formed on the sacrificial layer 150, the seed stopper 140, the etch stop layer 130 and the seeds 160 and 165 to fill the opening 155. In example embodiments, the lower electrode layer may be formed using a metal or a metal nitride. The metal may include copper (Cu), aluminum (Al), tungsten (W), rubidium (Rb), iridium (Ir), etc., and the metal nitride may include titanium nitride ($TiN_X$), tantalum nitride ($TaN_X$), tungsten nitride ($WN_X$), etc. In other example embodiments, the lower electrode layer may be formed using a doped polysilicon. An upper portion of the lower electrode layer may be removed until a top surface of the sacrificial layer 150 may be exposed by a CMP process and/or an etch-back process, thereby to form the lower electrode 175.

The lower electrode 175 may be formed on the seeds 160 and 165, and thus a sidewall of the lower electrode 175 may have a shape in accordance with a shape of the seeds 160 and 165. In example embodiments, the seeds 160 and 165 have a convex hemi-spherical shape, and accordingly the lower electrode 175 may have a sidewall having a concave hemi-spherical shape. As a result, the lower electrode 175 may have a large surface area when compared to a pillar-shape lower electrode having a planar surface.

Figure 6:
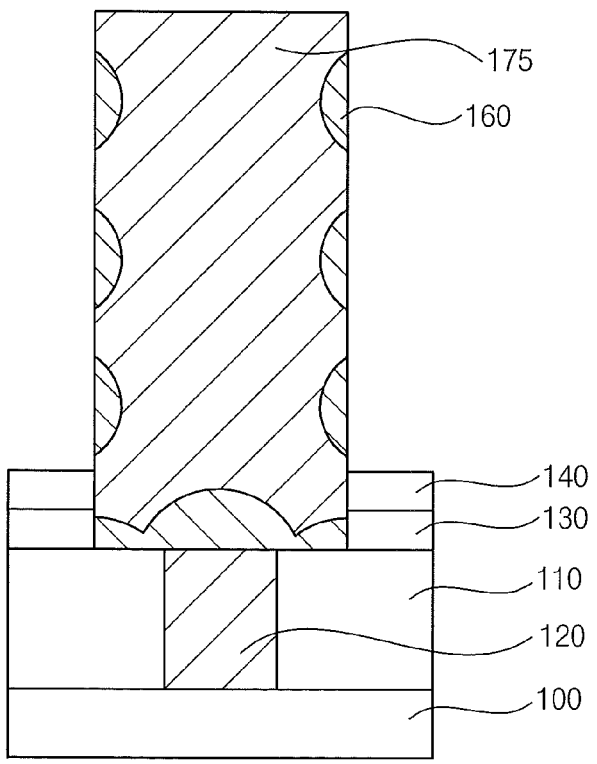

Referring to FIG. 6, the sacrificial layer 150 may be removed. In an example embodiment, the sacrificial layer 150 may be removed using limulus amoebocyte lysate (LAL) solution.

Figure 7:
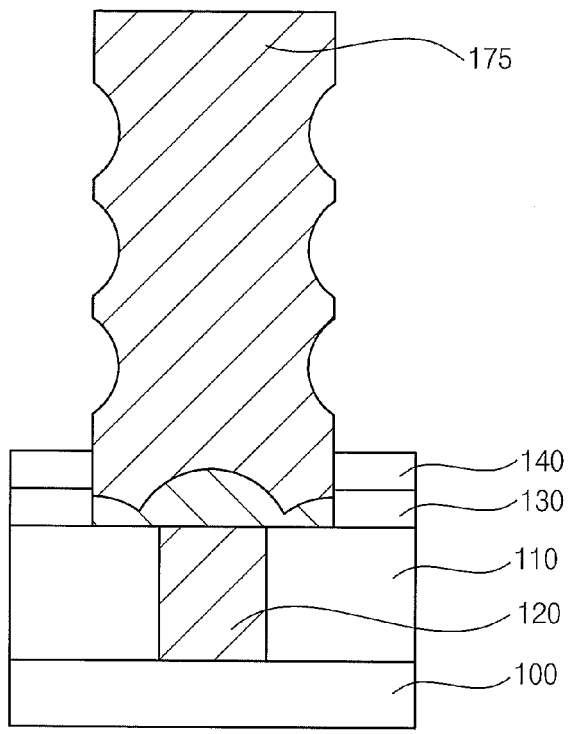

Referring to FIG. 7, the first seed 160 may be removed. In an example embodiment, the first seed 160 may be removed using standard cleaning 1 (SC1) solution. The seed stopper 140 may cover a lower portion of the lower electrode 175 so that the second seed 165 may not be exposed. Thus, the second seed 165 may remain under the lower electrode 175 while the first seed 160 may be removed.

Figure 8:
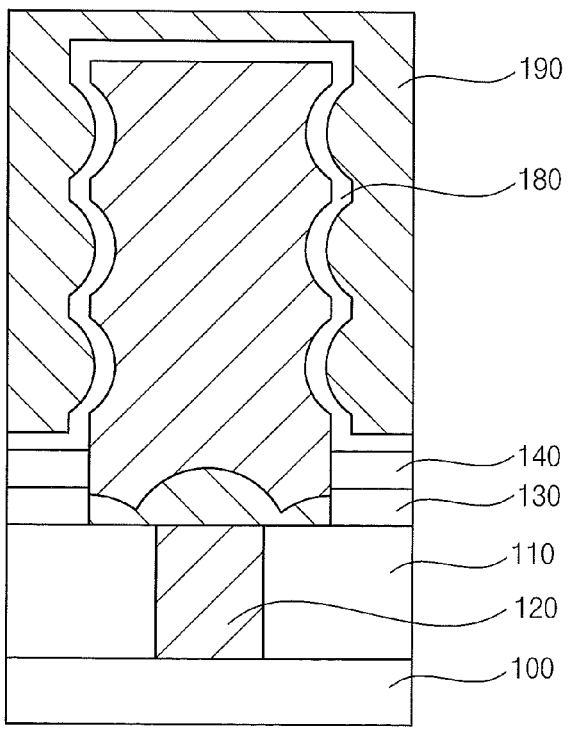

Referring to FIG. 8, a dielectric layer 180 and an upper electrode 190 may be sequentially formed on the lower electrode 175 and the seed stopper 140.

The dielectric layer 180 may be formed using a high-k material having a higher dielectric constant than that of silicon oxide or silicon nitride. The high-k material may include hafnium oxide ($HfO_x$), tantalum oxide ($TaO_x$), aluminum oxide ($AlO_x$), zirconium oxide ($ZrO_x$), etc. These may be used alone or in a mixture thereof. The dielectric layer 180 may be formed by a deposition process such as a CVD process, a PVD process, an ALD process, etc.

The upper electrode 190 may be formed using a metal or a metal nitride, or a doped polysilicon by a deposition process such as a CVD process, a PVD process, an ALD process, etc.

In an example embodiment, unlike FIG. 8, the upper electrode 190 may be formed to have a thin thickness.

The capacitor structure in FIG. 8 may include the lower electrode 175 on the plug 120 through the insulating interlayer 110, the seed stopper 140 on the etch stop layer 130 or the insulating interlayer 110, the dielectric layer 180 on the lower electrode 175 and the seed stopper 140, and the upper electrode 190 on the dielectric layer 180. The lower electrode 175 may include the sidewall having the concave hemi-spherical shape, the seed stopper 140 may contact a portion of the sidewall of the lower electrode 175 having no concave hemi-spherical shape. The capacitor structure may further include the second seed 165 between the plug 120 and the lower electrode 175.

FIGS. 9 to 12 are cross-sectional views illustrating a method of forming a capacitor according to Comparative Example.

Figure 9:
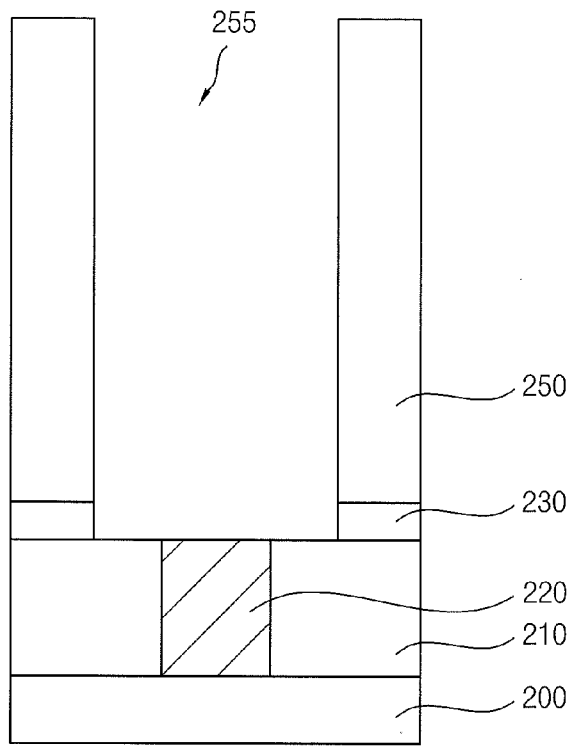
FIGS. 9 to 12 are cross-sectional views illustrating a method of forming a capacitor according to a comparative example.

Referring to FIG. 9, an insulating interlayer 210 may be formed on a substrate 200 and a plug 220 may be formed through the insulating interlayer 210. The plug 220 may be formed using a doped polysilicon or a metal, etc. An etch stop layer 230 and a sacrificial layer 250 may be formed sequentially on the insulating interlayer 210 and the plug 220. The etch stop layer 230 may be formed using silicon nitride, and the sacrificial layer 250 may be formed using an oxide such as propylene oxide (PDX), phenyltriethoxysilane (PTEOS), boro-phosphoro silicate glass (BPSG), phosphor silicate glass (PSG), etc. The sacrificial layer 250 and the etch stop layer 230 may be partially removed to form an opening 255 that may expose a top surface of the plug 220.

Figure 10:
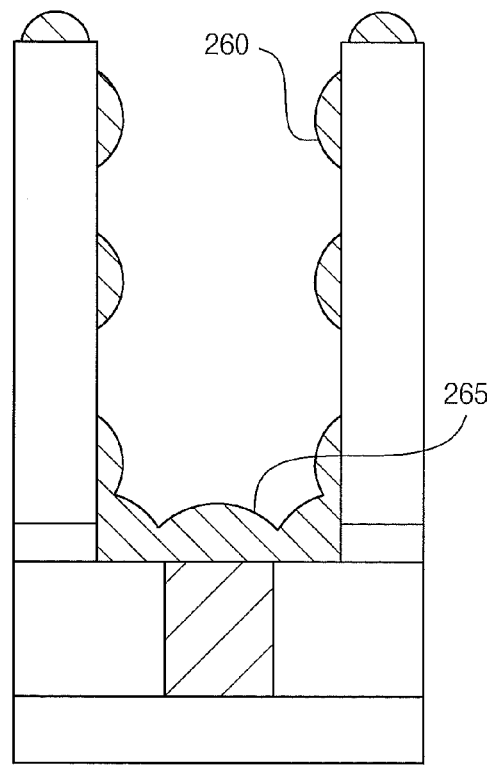

Referring to FIG. 10, seeds 260 and 265 may be formed on an inner wall of the opening 255. The seeds 260 and 265 may be formed on a sidewall of the sacrificial layer 250 including propylene oxide, etc., on a sidewall of the etch stop layer 230 including silicon nitride, and on the top surface of the plug 220 including the doped silicon, etc. The seeds 260 and 265 may be divided into a first seed 260 and a second seed 265 according to positions thereof. That is, the first seed 260 may be formed on a sidewall of the opening 255 and the second seed 265 may be formed on a bottom of the opening 255. However, some of the first seed 260 and the second seed 265 near a sidewall of the etch stop layer 230 may be merged, and thus may not be differentiated.

Figure 11:
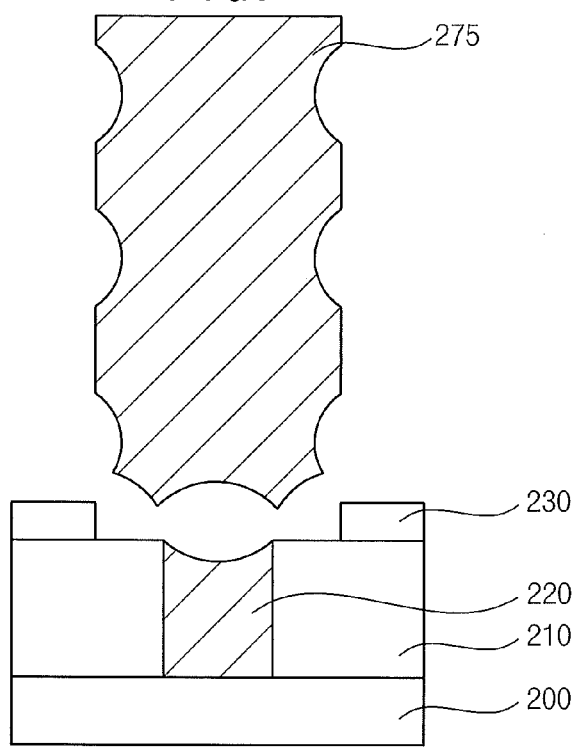

Referring to FIG. 11, a lower electrode 275 covering the seeds 260 and 265 may be formed to fill a remaining portion of the opening 255, and the sacrificial layer 250 and the first seed 260 may be removed. The second seed 265 formed near the etch stop layer 230 may be removed together with the first seed 260. Moreover, the second seed 265 on the plug 220 and the plug 220 itself may be partially removed. That is, when the first seed 260 is removed, the second seed 265 merged with the first seed 260 and the plug 220 having polysilicon may be also removed.

Figure 12:
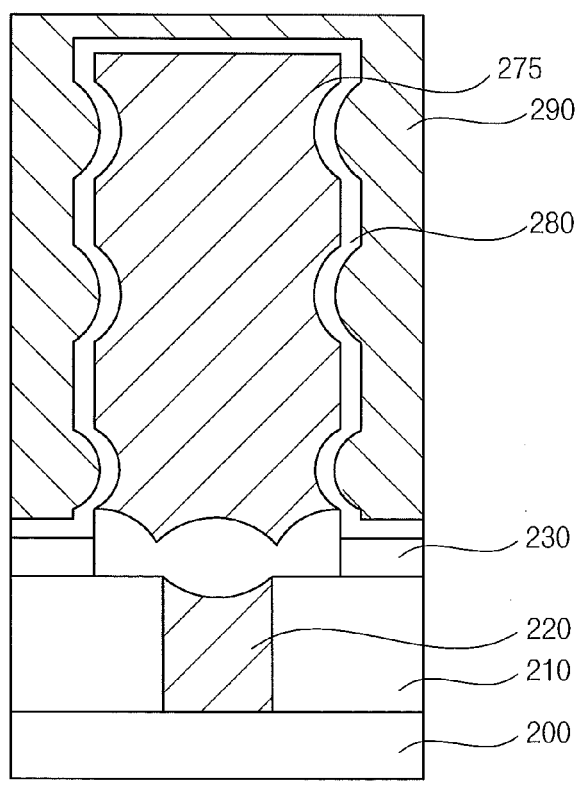

Referring to FIG. 12, a dielectric layer 280 and an upper electrode 290 may be formed sequentially on the lower electrode 275 and the etch stop layer 230 to form the capacitor.

Unlike the capacitor structure in accordance with example embodiments illustrated with reference to FIG. 8, the capacitor in accordance with Comparative Example illustrated with reference to FIG. 12 does not include the second seed 265, and may lose some portion of the plug 220, and thus the lower electrode 275 may have a bad contact with the plug 220. The capacitor structure in FIG. 8 may have the seed stopper 140 surrounding a lower sidewall of the lower electrode 175 to protect the second seed 165. However, the capacitor in FIG. 12 does not have the seed stopper 140, and thus the second seed 265 and some portion of the plug 220 may be removed. Thus, the capacitor structure in FIG. 8 may have a more stable structure and a higher reliability than the capacitor in FIG. 12.

FIGS. 13 to 16 are cross-sectional views illustrating a method of forming a capacitor structure in accordance with other example embodiments.

Figure 13:
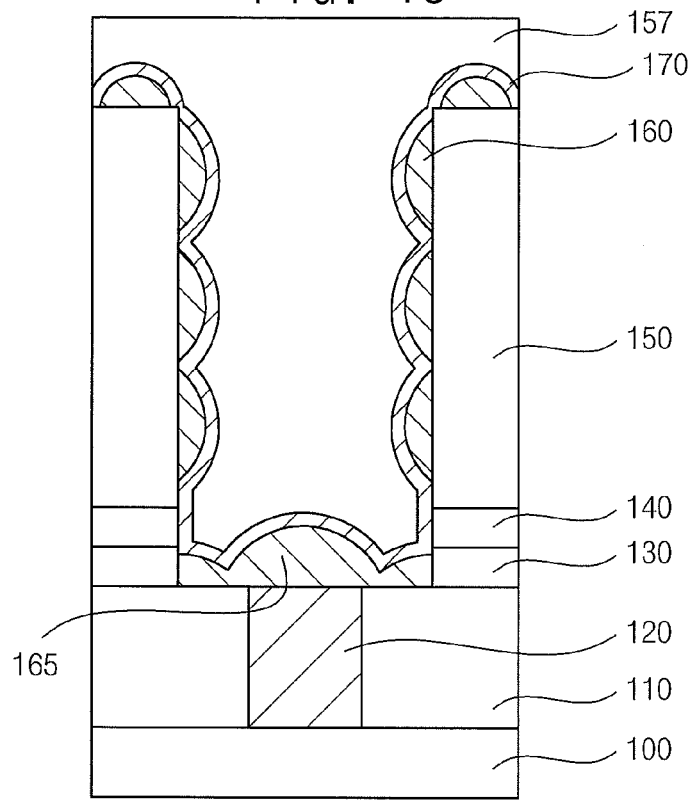
FIGS. 13 to 16 are cross-sectional views illustrating a method of forming a capacitor in accordance with example embodiments.

Referring to FIG. 13, processes substantially the same as those illustrated with reference to FIGS. 1 to 4 may be performed. A lower electrode layer 170 covering the seeds 160 and 165 may be formed conformally on an inner wall of the opening 155 and the first sacrificial layer 150. Particularly, the lower electrode layer 170 may not completely fill the remaining portion of the opening 155 unlike the lower electrode in FIG. 5, and may be formed as a thin layer. A second sacrificial layer 157 covering the lower electrode layer 170 may be formed to fill the remaining portion of the opening 155. The second sacrificial layer 157 may be formed using a material substantially the same as that of the first sacrificial layer 150.

Figure 14:
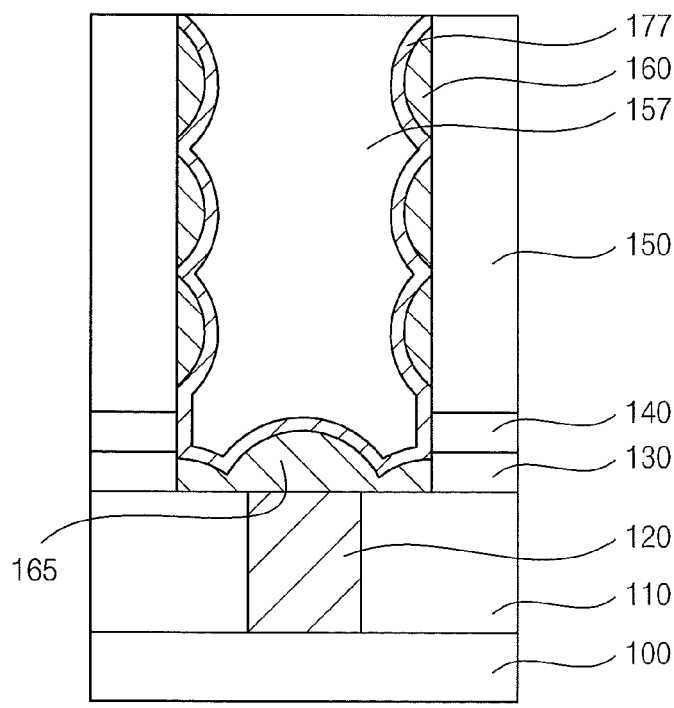

Referring to FIG. 14, an upper portion of the second sacrificial layer 157 and some portions of the lower electrode layer 170 and the first seed 160 on a top surface of the first sacrificial layer 150 may be removed until the top surface of the first sacrificial layer 150 may be exposed by a CMP process and/or an etch-back process.

Figure 15:
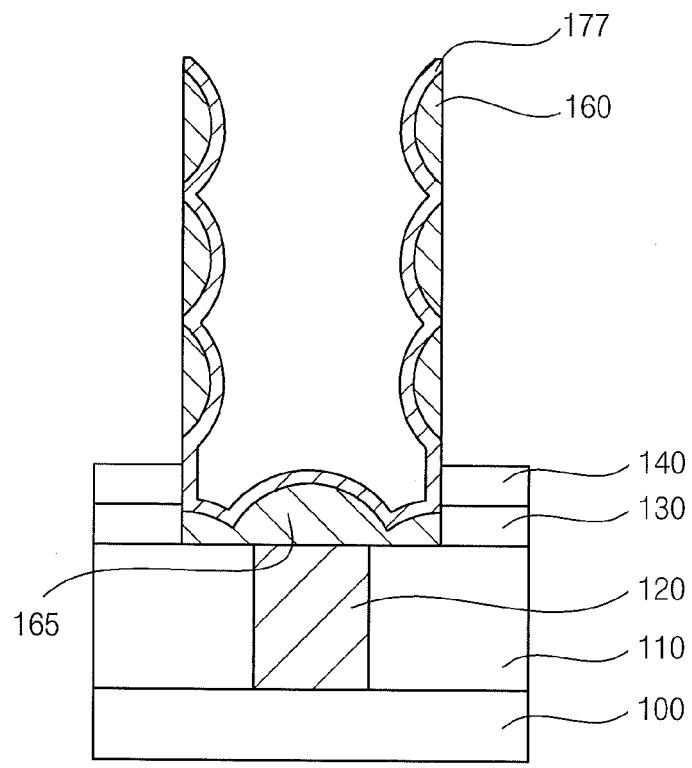

Referring to FIG. 15, the first sacrificial layer 150 and the second sacrificial layer 157 may be removed. In an example embodiment, the first sacrificial layer 150 and the second sacrificial layer 157 may be removed using limulus amoebocyte lysate (LAL) solution.

Figure 16:
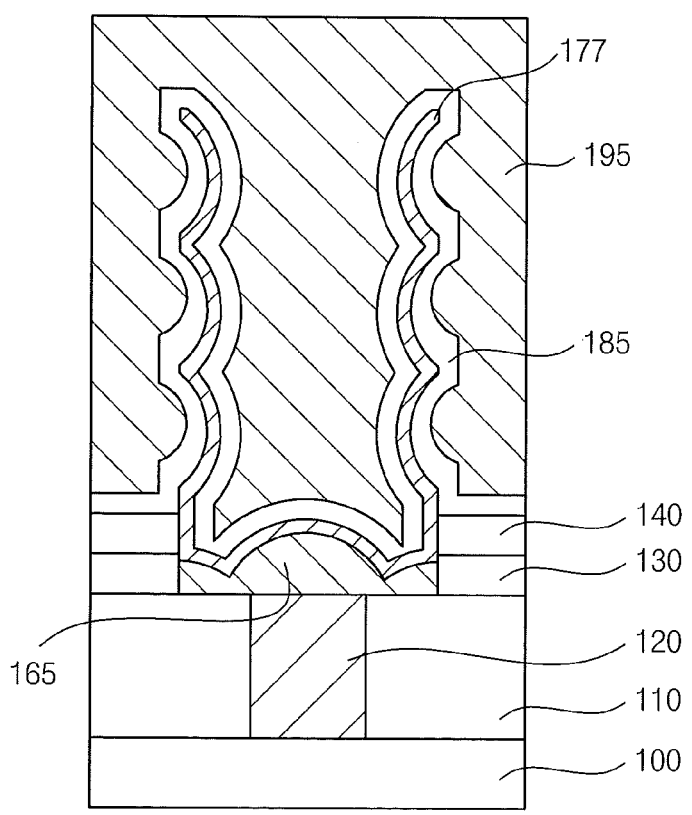

Referring to FIG. 16, the first seed 160 may be removed. In an example embodiment, the first seed 160 may be removed using standard cleaning 1 (SC1) solution. The seed stopper 140 may cover a lower portion of the lower electrode 175 so that the second seed 165 may be not exposed. A dielectric layer 185 and an upper electrode 195 may be formed sequentially on the lower electrode 175 and the seed stopper 140 to form a capacitor including the lower electrode 177, the dielectric layer 185 and the upper electrode 195.

In an example embodiment, unlike FIG. 16, the upper electrode 195 may be formed to have a thin thickness so that the capacitor may have a cylindrical shape.

FIGS. 17 to 21 are cross-sectional views illustrating a method of forming a capacitor structure in accordance with other example embodiments.

Figure 17:
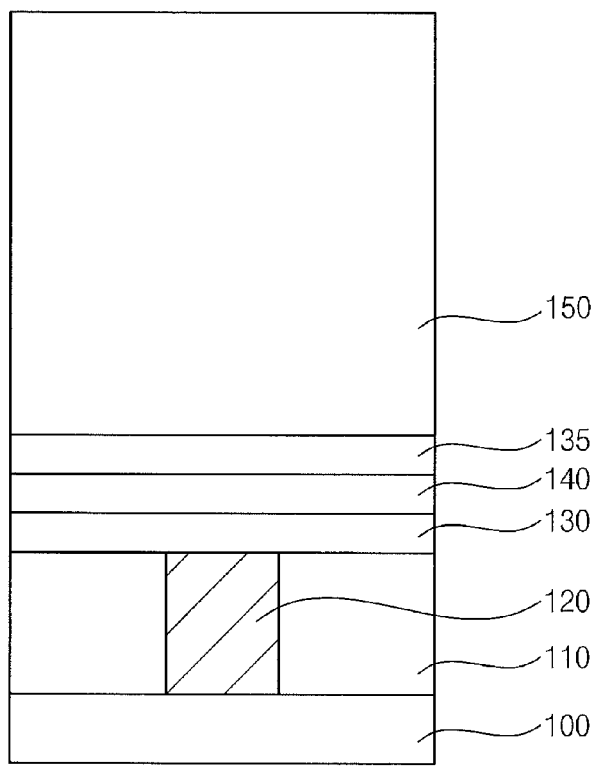
FIGS. 17 to 21 are cross-sectional views illustrating a method of forming a capacitor in accordance with example embodiments.

Referring to FIG. 17, an insulating interlayer 110 may be formed on a substrate 100. A first etch stop layer 130, a seed stopper 140, a second etch stop layer 135 and a sacrificial layer 150 may be formed sequentially on the insulating interlayer 110 and a plug 120. The seed stopper 140 may be formed using a thermal oxide such as silicon oxide, aluminum oxide, tantalum oxide, etc. The first etch stop layer 130 and the second etch stop layer 135 may be formed using silicon nitride by a deposition process a CVD process, a PVD process, an ALD process, etc.

Figure 18:
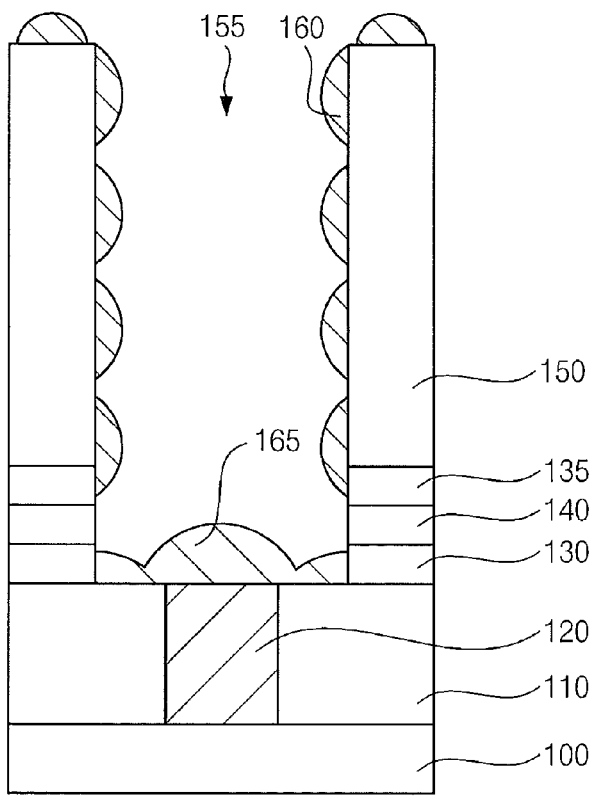

Referring to FIG. 18, the sacrificial layer 150, the second etch stop layer 135, the seed stopper 140, and the first etch stop layer 130 may be partially removed to form an opening 155 exposing the plug 120. Different kinds of etching gas may be used in each layer. Seeds 160 and 165 may be formed on an inner wall of the opening 155. The seeds 160 and 165 may be divided into a first seed 160 and a second seed 165 according to positions thereof. That is, the first seed 160 may be formed on sidewalls of the second etch stop layer 135 and the sacrificial layer 150, and may be not formed on a sidewall of the seed stopper 140. Further, the second seed 165 may be formed on the plug 120, and some of the second seed 165 may make contact with a sidewall of the first etch stop layer 130.

Figure 19:
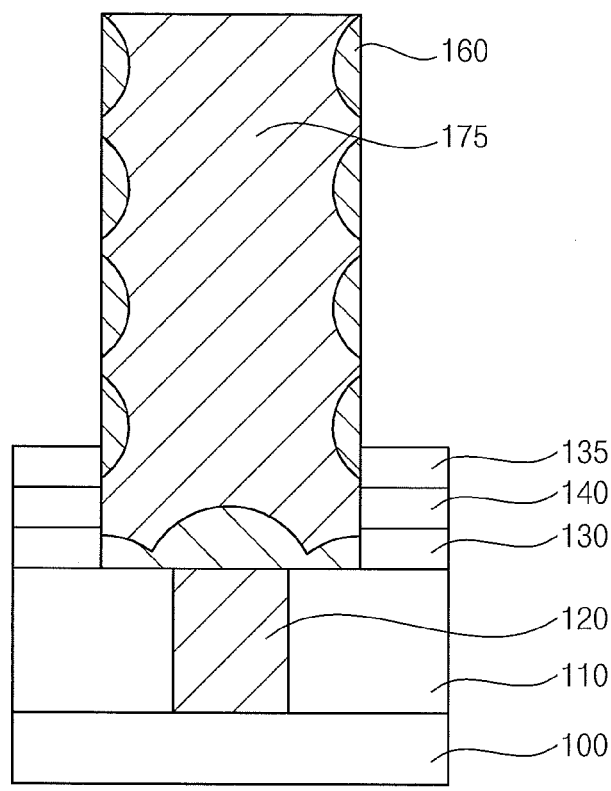

Referring to FIG. 19, the lower electrode 175 covering the seeds 160 and 165 may be formed to fill a remaining portion of the opening 155.

Figure 20:
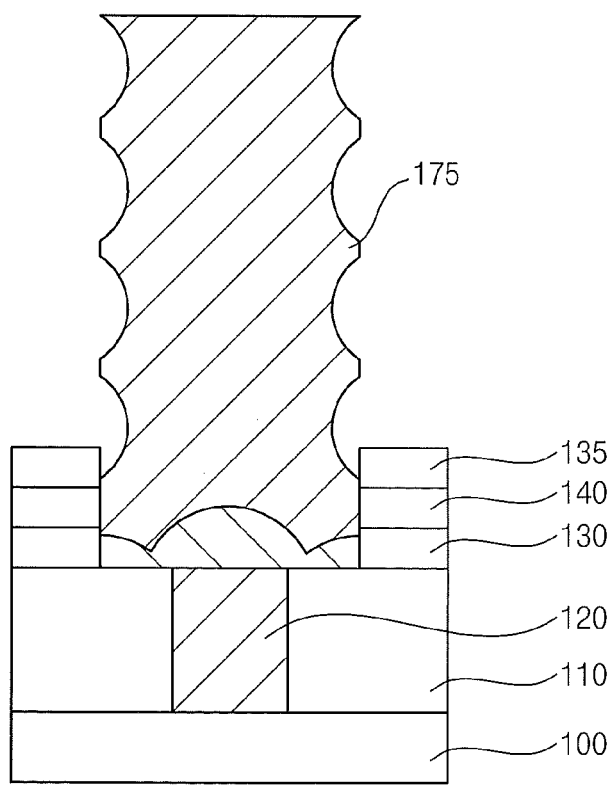

Referring to FIG. 20, the sacrificial layer 150 may be removed. In an example embodiment, the sacrificial layer 150 may be removed using limulus amoebocyte lysate (LAL) solution. The seed stopper 140 may not be removed together with the sacrificial layer 150 because the second etch stop layer may be formed on the seed stopper 140, even though the seed stopper 140 may include a material having an etching rate similar to that of the sacrificial layer 150.

In an example embodiment, the first seed 160 may be removed using standard cleaning 1 (SC1) solution. The first seed 160 near the sidewall of the second etch stop layer 135 may be removed as well. However, the second seed 165 may not be removed because the seed stopper 140 may cover the lower portion of the lower electrode 175 so that the second seed 165 may not be exposed to the outside.

Figure 21:
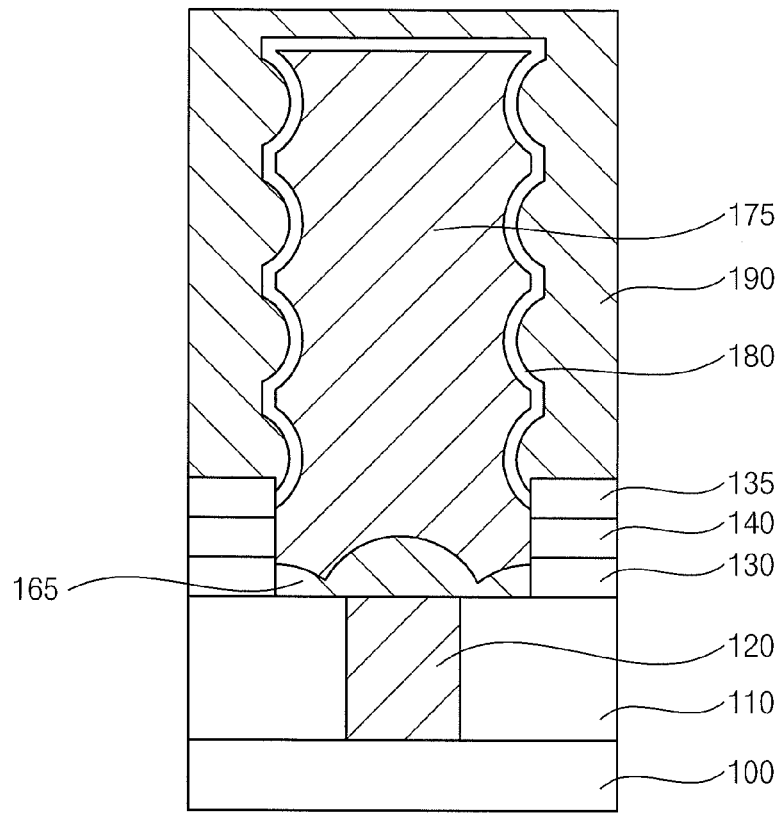

Referring to FIG. 21, the dielectric layer 180 and the upper electrode 190 may be formed sequentially on the lower electrode 180 and the seed stopper 140.

The capacitor structure in FIG. 21 may include the lower electrode 175 on the plug 120 through the insulating interlayer 110, the seed stopper 140 on the first etch stop layer 130 or the insulating interlayer 110, the second etch stop layer 135 on the seed stopper 140, the dielectric layer 180 on the lower electrode 175, and the upper electrode 190 on the dielectric layer 180. The lower electrode 175 may include a sidewall having a concave hemi-spherical shape, and the seed stopper 140 may contact a portion of the sidewall of the lower electrode 175 having no concave hemi-spherical concave shape. The capacitor structure may further include the second seed 165 between the plug 120 and the lower electrode 175.

When the sacrificial layer 150 is removed, the second etch stop layer 135 may protect the seed stopper 140. As a result, the second seed 165 and the plug 120 may be protected. Thus, the capacitor structure may have a stable structure and a high reliability.

Figure 22:
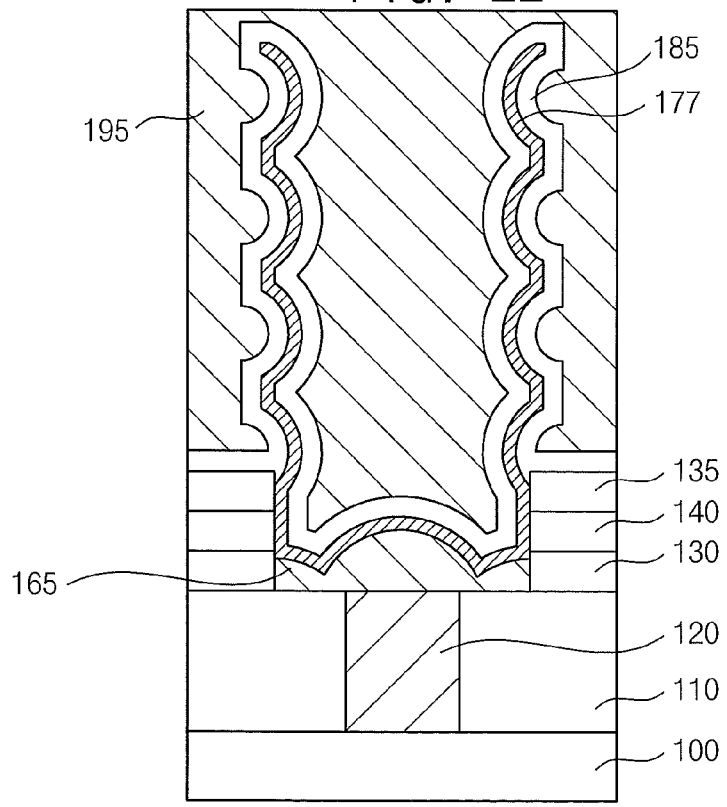
FIG. 22 is a cross-sectional view illustrating a method of forming a capacitor in accordance with example embodiments.

FIG. 22 is a cross-sectional view illustrating a method of forming a capacitor structure according to other example embodiments. The lower electrode 177 of the capacitor structure may have a cylindrical shape. When the upper electrode 195 may be formed to have a thin thickness, the capacitor including the lower electrode 177, the dielectric layer 185 and the upper electrode 195 may have a cylindrical shape. The capacitor in FIG. 22 may be similar to the capacitor in FIG. 21 except the shape of the capacitor, and the method of forming the cylindrical capacitor illustrated with reference to FIGS. 13 to 16 may be applied to the formation of the capacitor in FIG. 22.

Figure 23:
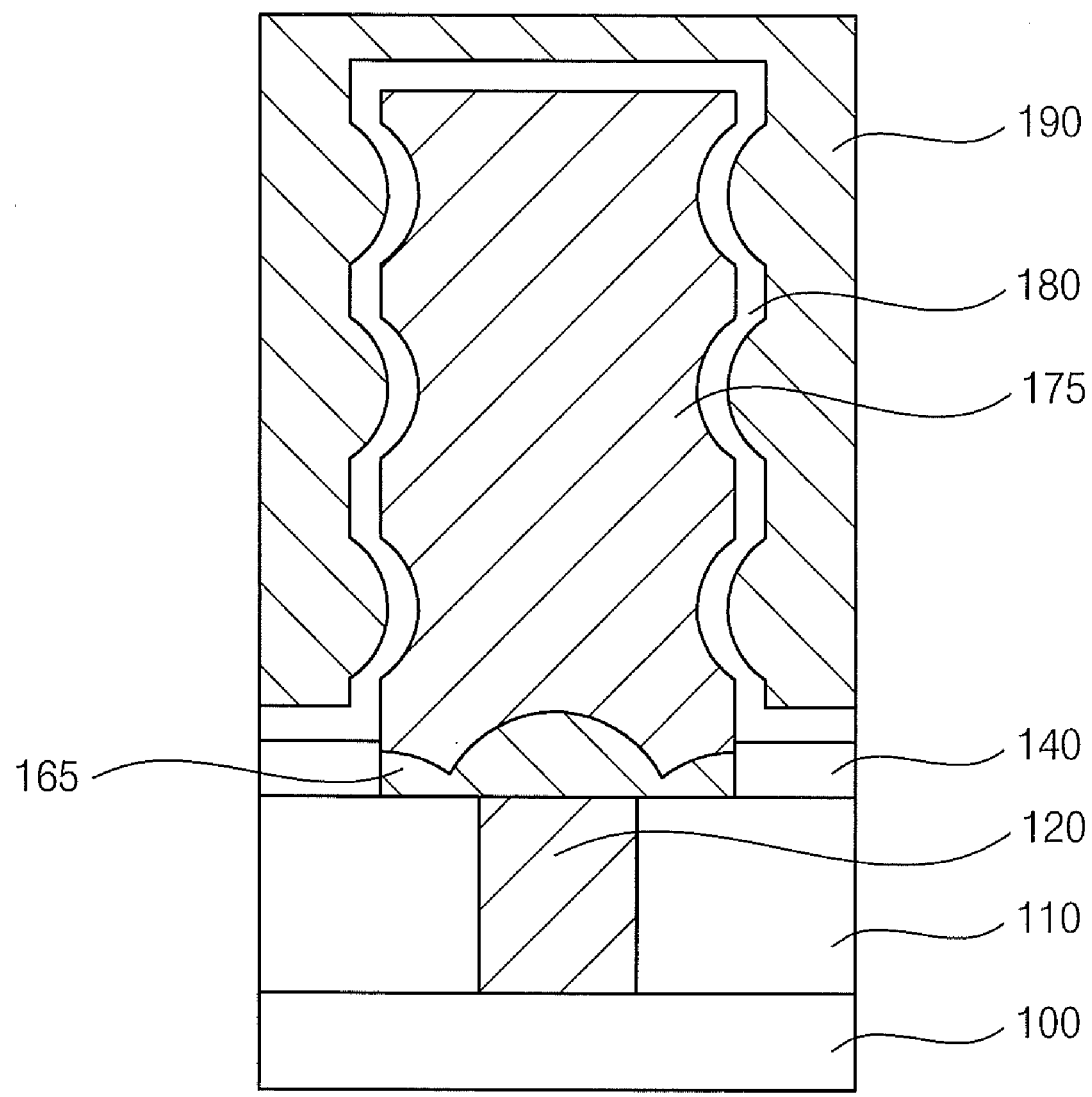
FIG. 23 is a cross-sectional view illustrating a method of forming a capacitor in accordance with example embodiments.

FIG. 23 is a cross-sectional view illustrating a method of forming a capacitor structure in accordance with other example embodiments. The seed stopper 140 in FIG. 23 may serve as both of a seed stopper and an etch stop layer. Particularly, the seed stopper 140 may be formed using a material such as tantalum oxide ($TaO_X$) that may have a long initial time for the deposition of seeds 160 and 165 and an etching selectivity with respect to the sacrificial layer 150 including propylene oxide, etc. Thus, the seed stopper 140 may have various functions of, e.g., serving as an etching endpoint, protecting the second seed 165 during the removal of the sacrificial layer 150, preventing the deposition of the seeds 160 and 165, etc.

Figure 24:
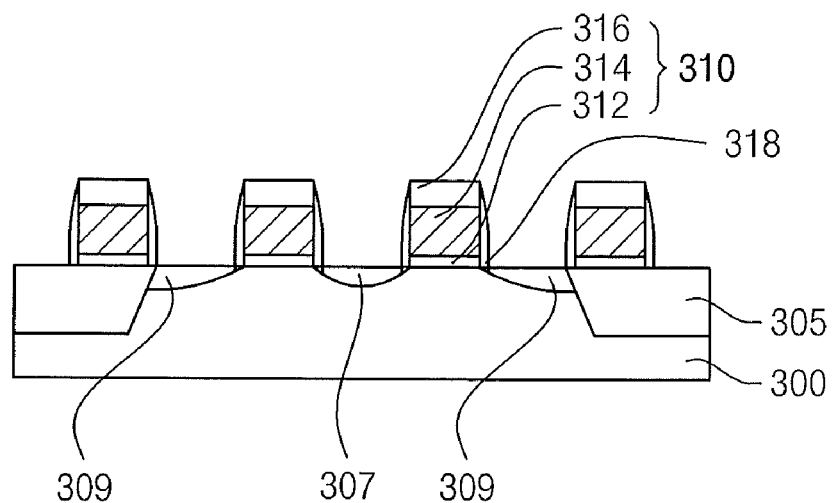
FIGS. 24 to 26 are cross-sectional views illustrating a method of forming a semiconductor device according to example embodiments.
Figure 25:
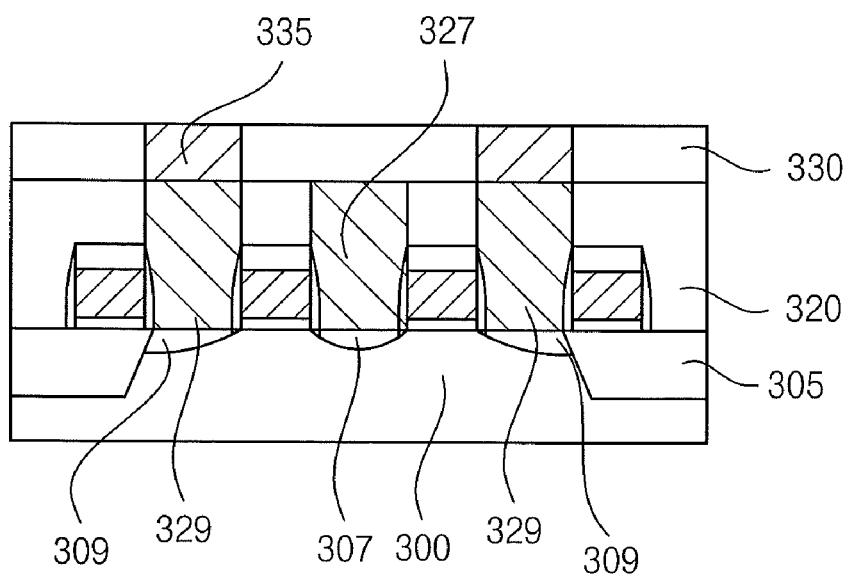
Figure 26:
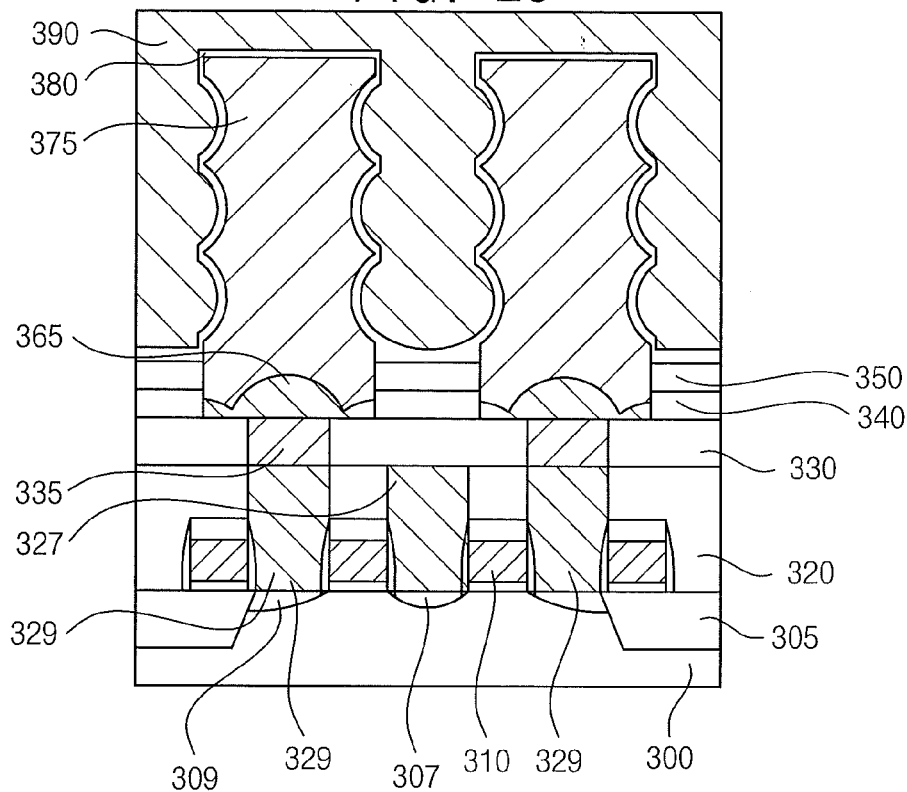

FIGS. 24 to 26 are cross-sectional views illustrating a method of manufacturing a semiconductor device in accordance with example embodiments.

Referring to FIG. 24, an isolation layer 305 may be formed on a substrate 300. In an example embodiment, the isolation layer 305 may be formed by a shallow trench isolation (STI) process.

A gate insulating layer, a gate electrode layer, and a hard mask layer may be formed sequentially on the substrate 300 and patterned by a photolithography process to faun a plurality of gate structures 310 including a gate insulating layer pattern 312, a gate electrode 314, and a hard mask 316 sequentially stacked on the substrate 300. The gate insulating layer may be formed using silicon oxide or a metal oxide. The gate electrode layer may be formed using a doped polysilicon or a metal. The hard mask layer may be formed using silicon nitride.

A first impurity region 307 and second impurity regions 309 may be formed at upper portions of the substrate 300 adjacent to the gate structures 310 by an ion implantation process using the gate structures 310 as ion implantation masks. The first and second impurity regions 307 and 309 may serve as source/drain regions of a transistor.

The gate structures 310 and the impurity regions 307 and 309 may form the transistor. Spacers 318 may be further formed on sidewalls of the gate structures 310 using silicon nitride.

Referring to FIG. 25 a first insulating interlayer 320 covering the gate structures 310 and the spacers 318 may be formed on the substrate 300. The first insulating interlayer 310 may be partially removed to form first holes (not shown) exposing the impurity regions 307 and 309. In an example embodiment, the first holes may be self-aligned with the gate structures 310 and the spacers 318. A first conductive layer filling the first holes may be formed on the substrate 300 and the first insulating interlayer 320, and an upper portion of the conductive layer may be removed until the first insulating interlayer 320 may be exposed by a CMP process and/or an etch-back process, thereby to form a first plug 327 and second plugs 329 in the first holes. The first plug 327 may make contact with the first impurity region 307 and the second plugs 329 may make contact with the second impurity regions 309. The first conductive layer may be formed using a doped polysilicon, a metal, etc. The first plug 327 may serve as a bit line contact.

A second conductive layer (not shown) contacting the first plug 327 may be formed on the first insulating interlayer 320 and may be patterned to form a bit line (not shown) on the first insulating interlayer 320. A second insulating interlayer 330 covering the bit line may be formed on the first insulating interlayer 330. The second insulating interlayer 330 may be partially etched to form second holes (not shown) exposing the second plugs 329. A third conductive layer filling the second holes may be formed on the second plugs 329 and the second insulating interlayer 330. An upper portion of the third conductive layer may be removed until the second insulating interlayer 320 may be exposed by a CMP process and/or an etch-back process, thereby to form third plugs 335 in the second holes. The second plugs 329 and the third plugs 335 may serve as capacitor contacts. Alternatively, the third plugs 335 may make direct contact with the second impurity regions 309 without the second plugs 329, thereby to serve as the capacitor contact solely.

Referring to FIG. 26, processes substantially the same as those illustrated with reference to FIGS. 2 to 8 may be performed to form a capacitor structure. The capacitor structure may include a lower electrode 375 on the third plugs 335 through the second insulating interlayer 330, a seed stopper 340 on the etch stop layer 330 or the second insulating interlayer 330, a dielectric layer 380 on the lower electrode 375 and the seed stopper 340, and an upper electrode 390 on the dielectric layer 380. The lower electrode 375 may include the sidewall having the concave hemi-spherical shape, the seed stopper 340 may contact a portion of the sidewall of the lower electrode 375 having no concave hemi-spherical shape. The capacitor structure may further include the second seed 365 between the third plugs 335 and the lower electrode 375.

The transistor and the semiconductor device may be completed by the above the processes.

Figure 27:
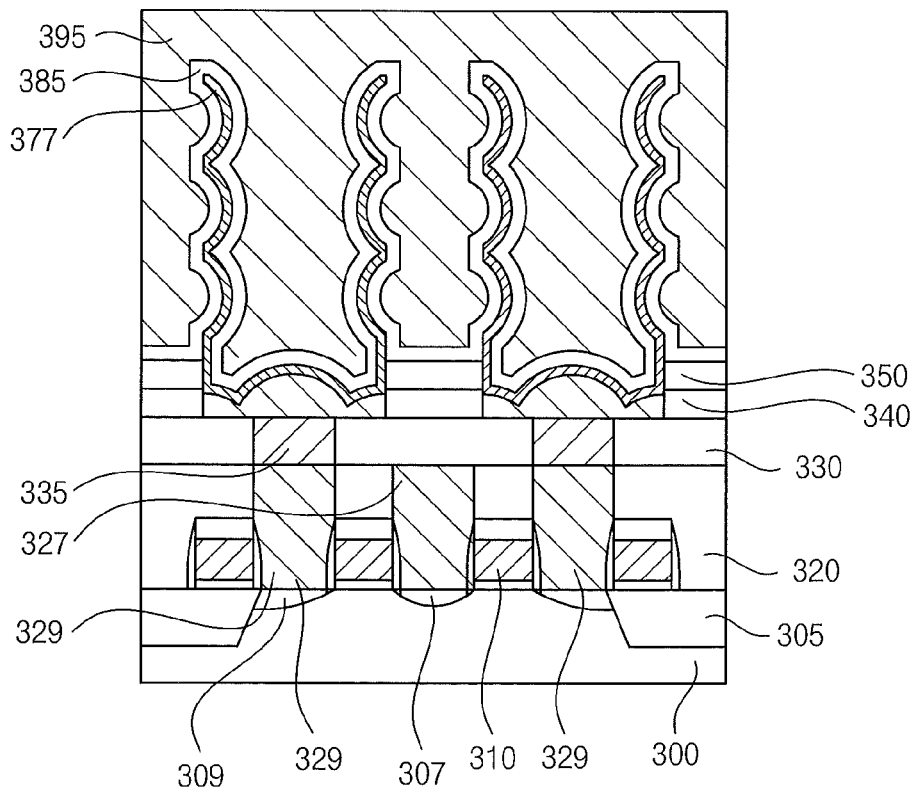
FIG. 27 is a cross-sectional view illustrating a method of forming a semiconductor device in accordance with example embodiments.

FIG. 27 is a cross-sectional view illustrating a method of manufacturing a semiconductor device in accordance with other example embodiments. The semiconductor device in FIG. 27 may include a cylindrical lower electrode 377. When an upper electrode 395 may be formed to have a thin thickness, a capacitor may have a cylindrical shape entirely.

According to example embodiments, when the lower electrode may be formed using the hemi-spherical grain as the seed, the seed stopper may be formed to prevent the loss of the plug contacting the lower electrode. Thus, a capacitor may have a large capacitance and a good contact with the plug, and a semiconductor device including the capacitor may have an improved reliability.

The foregoing is illustrative of example embodiments and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of forming a capacitor structure, comprising:
   forming a seed stopper and a sacrificial layer on an insulating interlayer having a plug therethrough;
   forming an opening through the sacrificial layer and the seed stopper to expose the plug;
   forming a seed on an inner wall of the opening;
   forming a lower electrode covering the seed on the inner wall of the opening;
   removing the sacrificial layer and the seed; and
   sequentially forming a dielectric layer and an upper electrode on the lower electrode.

2. The method of claim 1, wherein the seed is not formed on the seed stopper.

3. The method of claim 1, further comprising:
   forming a first etch stop layer on the plug and the insulating interlayer prior to forming the seed stopper and the sacrificial layer on the insulating interlayer.

4. The method of claim 3, wherein the sacrificial layer is formed using at least one of propylene oxide (PDX), phenyltriethoxysilane (PTEOS), boro-phosphoro silicate glass (BPSG) and phosphor silicate glass (PSG), and wherein the first etch stop layer is formed using silicon nitride.

5. The method of claim 1, wherein forming the seed stopper and the sacrificial layer includes forming a second etch stop layer on the seed stopper.

6. The method of claim 1, wherein the lower electrode sufficiently fills a remaining portion of the opening.

7. The method of claim 1, wherein the seed stopper is formed using silicon oxide, aluminum oxide or tantalum oxide.

8. The method of claim 1, wherein forming the seed is performed by a low pressure chemical vapor deposition (LPCVD) process or a rapid thermal chemical vapor deposition (RTCVD) process.

9. The method of claim 8, wherein forming the seed is performed using silicon source gas or using silicon source gas and germanium source gas.

10. The method of claim 1, wherein the sacrificial layer is removed using limulus amoebocyte lysate (LAL) solution and the seed is removed using standard cleaning 1 (SC1) solution.

11. The method of claim 1, wherein the lower electrode is formed using a metal or a metal nitride.

12. The method of claim 11, wherein the lower electrode is formed using at least one of copper (Cu), aluminum (Al), tungsten (Tu), rubidium (Rb), iridium (Ir), titanium nitride (TiNX), tantalum nitride (TaNX) and tungsten nitride (WNX).

13. The method of claim 1, wherein the plug includes polysilicon or a metal.

14. The method of claim 1, wherein the seed includes a hemi-spherical grain (HSG).

15. A method of manufacturing a semiconductor device, comprising:
   forming a transistor including a gate structure and an impurity region on a substrate;
   forming an insulating interlayer having a plug therein and covering the transistor on the substrate, the plug being electrically connected to the impurity region:
   forming a seed stopper and a sacrificial layer on the insulating interlayer:
   forming an opening through the sacrificial layer and the seed stopper to expose the plug;
   forming a seed on an inner wall of the opening;
   forming a lower electrode covering the seed on the inner wall of the opening;
   removing the sacrificial layer and the seed; and
   sequentially forming a dielectric layer and an upper electrode on the lower electrode.

* * * * *